United States Patent
Wang (10) Patent No.: US 11,316,122 B2
(45) Date of Patent: Apr. 26, 2022

(54) OLED DISPLAY PANEL HAVING LIGHT-EMITTING LAYER COMPRISING ORGANIC HOST MATERIAL, ORGANIC LIGHT-EMITTING MATERIAL AND AMORPHOUS FLUOROPOLYMER AND MANUFACTURING METHOD THEREOF, AND OLED DEVICE HAVING THE SAME

(71) Applicant: SHENZHEN CHINA STAR OPTOELECTRONICS SEMICONDUCTOR DISPLAY TECHNOLOGY CO., LTD., Guangdong (CN)

(72) Inventor: Shipan Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 235 days.

(21) Appl. No.: 16/620,220

(22) PCT Filed: Nov. 25, 2019

(86) PCT No.: PCT/CN2019/120467
§ 371 (c)(1),
(2) Date: Dec. 6, 2019

(87) PCT Pub. No.: WO2021/082125
PCT Pub. Date: May 6, 2021

(65) Prior Publication Data
US 2021/0328167 A1    Oct. 21, 2021

(30) Foreign Application Priority Data
Oct. 31, 2019  (CN) .......................... 201911054830.1

(51) Int. Cl.
*H01L 51/50* (2006.01)
*H01L 27/32* (2006.01)
(Continued)

(52) U.S. Cl.
CPC .......... *H01L 51/5024* (2013.01); *H01L 51/56* (2013.01); *H01L 27/3244* (2013.01);
(Continued)

(58) Field of Classification Search
CPC . H01L 51/5024; H01L 51/56; H01L 27/3244; H01L 51/004; H01L 51/0056
See application file for complete search history.

(56) References Cited

U.S. PATENT DOCUMENTS

2009/0189148 A1     7/2009  Araumi et al.
2009/0243466 A1*   10/2009  Yokoyama .......... H01L 51/5016
                                                                    313/502
(Continued)

FOREIGN PATENT DOCUMENTS

CN      101278404 A    10/2008
CN      108641707 A    10/2018
CN      109153684 A     1/2019

*Primary Examiner* — Michael Jung (57) ABSTRACT

The present invention provides an OLED display panel and a manufacturing thereof, and an OLED device. The OLED display panel adopts organic host materials, organic light-emitting materials, and amorphous fluoropolymers to produce a light-emitting layer, so that amorphous polymers improve thermal stability and solvent resistance of the light-emitting layer, and the light-emitting layer is not damaged by solvents when an electron transport layer is formed by solvents, thereby resolving the process of processing OLED devices by solvents having damage to the light-emitting layer causing poor display performance in the prior art.

20 Claims, 4 Drawing Sheets

(51) Int. Cl.
*H01L 51/56* (2006.01)
*H01L 51/00* (2006.01)

(52) U.S. Cl.
CPC ........ *H01L 51/004* (2013.01); *H01L 51/0056* (2013.01); *H01L 2227/323* (2013.01); *H01L 2251/558* (2013.01)

(56) References Cited

U.S. PATENT DOCUMENTS

| | | | |
|---|---|---|---|
| 2012/0187382 A1* | 7/2012 | Rostovtsev | H01L 51/0059 257/40 |
| 2017/0229606 A1* | 8/2017 | Kim | H01L 33/002 |
| 2018/0340033 A1 | 11/2018 | Price et al. | |
| 2019/0372018 A1 | 12/2019 | Yi | |
| 2020/0013959 A1 | 1/2020 | Gao et al. | |
| 2020/0176692 A1* | 6/2020 | Watabe | F21S 2/00 |
| 2021/0143367 A1* | 5/2021 | Ichikawa | H01L 27/322 |

* cited by examiner

OLED DISPLAY PANEL HAVING LIGHT-EMITTING LAYER COMPRISING ORGANIC HOST MATERIAL, ORGANIC LIGHT-EMITTING MATERIAL AND AMORPHOUS FLUOROPOLYMER AND MANUFACTURING METHOD THEREOF, AND OLED DEVICE HAVING THE SAME

FIELD OF INVENTION

The disclosure relates to the display field, and more particularly, to an OLED display panel and a manufacturing method thereof, and an OLED display device.

BACKGROUND OF INVENTION

Organic light-emitting diodes (OLED) are widely used in the display field because of their self-luminousity, wide viewing angles, wide color gamut, low energy consumption, high efficiency, fast responses, ultra-light and ultra-thin, and easy flexibility. In order to improve material utilization and reduce cost, OLED devices prevent from using vacuum evaporation process in the prior art, but use solvents to process OLED devices. However, in the process of processing OLED devices by solvents, since the solvent of printing electron transport layer may cause damage to the light-emitting layer, the display performance may be poor.

So, the process of processing OLED devices by solvents having damage to the light-emitting layer cause poor display performance in the prior art.

SUMMARY OF INVENTION

The present disclosure provides an OLED display panel and a manufacturing method thereof, and an OLED display device used to resolve the process of processing OLED devices by solvents having damage to the light-emitting layer causing poor display performance in the prior art.

To resolve the above technical problem, the technical solutions provided by the present disclosure are as follows.

The present disclosure provides an OLED display panel, the OLED display panel comprises a substrate, a driving circuit layer disposed on one side of the substrate, a light-emitting functional layer disposed on one side of the driving circuit layer away from the substrate; a pixel electrode layer, a hole injecting layer, a hole transport layer, a light-emitting layer, an electron transport layer, an electron injecting layer, and a common electrode layer which are sequentially disposed along a direction away from the substrate, and an encapsulation layer disposed on one side of the light-emitting functional layer away from the driving circuit layer.

Wherein, a material of the light-emitting layer comprises an organic host material, an organic light-emitting material, and an amorphous fluoropolymer.

In the OLED display panel provided by the present disclosure, a mass fraction of the organic host material in the light-emitting layer ranges from 10% to 80%.

In the OLED display panel provided by the present disclosure, the organic host material comprises 4,4'-Bis(9-carbazolyl)biphenyl, 1,3-Bis(9-carbazolyl)benzene, and 3,3'-Bis(9H-Carbozol-9-yl)-1,1'-biphenyl.

In the OLED display panel provided by the present disclosure, a mass fraction of the organic light-emitting material in the light-emitting layer ranges from 1% to 30%.

In the OLED display panel provided by the present disclosure, the organic light-emitting material comprises dichloromethane, Tris(2-phenylpyridine)iridium, and 2,4,5,6-Tetra(9-carbazolyl)isophthalonitrile.

In the OLED display panel provided by the present disclosure, a mass fraction of the amorphous fluoropolymer in the light-emitting layer ranges from 5% to 50%.

In the OLED display panel provided by the present disclosure, the amorphous fluoropolymer comprises amorphous polytetrafluoroethylene.

In the OLED display panel provided by the present disclosure, a thickness of the light-emitting layer ranges from 1 nm to 100 nm.

In the OLED display panel provided by the present disclosure, a material of the electron transport layer comprises an organic small molecule electron transport material.

In the OLED display panel provided by the present disclosure, the organic small molecule electron transport material comprises 2,7-bis(diphenylphosphoryl)-9,9'-spi-robi[fluorene].

In the OLED display panel provided by the present disclosure, a thickness of the electron transport layer ranges from 1 nm to 100 nm.

In the OLED display panel provided by the present disclosure, a material of the electron injecting layer comprises an alkali metal and a salt thereof, an alkaline earth metal and a salt thereof, and a metal complex.

In the OLED display panel provided by the present disclosure, a material of the electron injecting layer comprises lithium fluoride.

In the OLED display panel provided by the present disclosure, a thickness of the electron injecting layer ranges from 1 nm to 100 nm.

In the OLED display panel provided by the present disclosure, a material of the common electrode layer comprises one of indium tin oxide and indium zinc oxide.

Meanwhile, the present disclosure provides an OLED display device, the OLED display device comprises an OLED display panel, and the display panel comprises a substrate, a driving circuit layer disposed on one side of the substrate, a light-emitting functional layer disposed on one side of the driving circuit layer away from the substrate; a pixel electrode layer, a hole injecting layer, a hole transport layer, a light-emitting layer, an electron transport layer, an electron injecting layer, and a common electrode layer which are sequentially disposed along a direction away from the substrate, and an encapsulation layer disposed on one side of the light-emitting functional layer away from the driving circuit layer.

Wherein, a material of the light-emitting layer comprises an organic host material, an organic light-emitting material, and an amorphous fluoropolymer.

Meanwhile, the present disclosure provides a manufacturing method of the OLED display panel, the manufacturing method of the OLED display panel comprises providing a substrate, disposing a driving circuit layer on the substrate; disposing a pixel electrode layer on the driving circuit layer, disposing a hole injecting layer on the pixel electrode layer; disposing a hole transport layer on the hole injecting layer; disposing a light-emitting layer on the hole transport layer using an organic host material, an organic light-emitting material, and an amorphous fluoropolymer; disposing an electron transport layer on the light-emitting layer; disposing an electron injecting layer on the electron transport layer; disposing a common electrode layer on the electron injecting layer to produce a light-emitting functional layer comprising the pixel electrode layer, the hole injecting layer, the hole transport layer, the light-emitting layer, the electron transport layer, the electron injecting layer, and the common electrode layer; and disposing an encapsulation layer on the light-emitting functional layer.

In the manufacturing method of the OLED display panel provided by the present disclosure, the step of disposing a light-emitting layer on the hole transport layer using an organic host material, an organic light-emitting material, and an amorphous fluoropolymer comprises providing the organic host material, the organic light-emitting material, and the amorphous fluoropolymer; mixing the organic host material, the organic light-emitting material, the amorphous fluoropolymer, and a specific solvent to produce a light-emitting layer solvent; and disposing the light-emitting layer on the hole transport layer using the light-emitting layer solvent.

In the manufacturing method of the OLED display panel provided by the present disclosure, the step of mixing the organic host material, the organic light-emitting material, the amorphous fluoropolymer, and the specific solvent to produce a light-emitting layer solvent comprises providing a mixture of a fluorine solvent and an aromatic hydrocarbon solvent to be the specific solvent, dissolving the organic host material, the organic light-emitting material, and the amorphous fluoropolymer in the mixture of the fluorine solvent and the aromatic hydrocarbon solvent to produce a mixed solvent, and processing the mixed solvent under a specific condition to produce the light-emitting layer solvent.

In the manufacturing method of the OLED display panel provided by the present disclosure, the step of disposing the light-emitting layer on the hole transport layer using the light-emitting layer solvent comprises printing the light-emitting layer solvent on the hole transport layer, and drying and baking the light-emitting layer solvent to produce the light-emitting layer.

The present disclosure provides an OLED display panel and a manufacturing method thereof, and an OLED display device. The OLED display panel comprises a substrate, a driving circuit layer, a light-emitting functional layer, and an encapsulation layer. The driving circuit layer is disposed on one side of the substrate, the light-emitting functional layer is disposed on one side of the driving circuit layer away from the substrate; and a pixel electrode layer, a hole injecting layer, a hole transport layer, a light-emitting layer, an electron transport layer, an electron injecting layer, and a common electrode layer which are sequentially disposed along a direction away from the substrate, and the encapsulation layer is disposed on one side of the light-emitting functional layer away from the driving circuit layer. Wherein, a material of the light-emitting layer comprises an organic host material, an organic light-emitting material, and an amorphous fluoropolymer. The light-emitting layer is formed of organic host materials, organic light-emitting materials, and amorphous fluoropolymers, so that amorphous polymers improve thermal stability and solvent resistance of the light-emitting layer. Due to the solvent corrosion resistance of the light-emitting layer improved, the light-emitting layer is not damaged by solvents when the electron transport layer is formed by solvents, thereby the light-emitting layer is not damaged when a film layer of the OLED display panel is formed by solvents, therefore an organic layer of the OLED display panel may be formed by whole solvents. The film layer of the OLED display panel is not damaged when the organic layer is formed by whole solvents, thereby resolving the process of processing OLED devices by solvents having damage to the light-emitting layer causing poor display performance in the prior art.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as upper, lower, front, back, left, right, inner, outer, side, etc., are only directions by referring to the accompanying drawings. Thus, the used directional terms are used to describe and understand the present disclosure, but the present disclosure is not limited thereto. In figures, elements with similar structures are indicated by the same numbers.

The present application is directed to the process of processing OLED devices by solvents having damage to the light-emitting layer causing poor display performance in the prior art. The present embodiment can resolve the defects.

Figure 1:
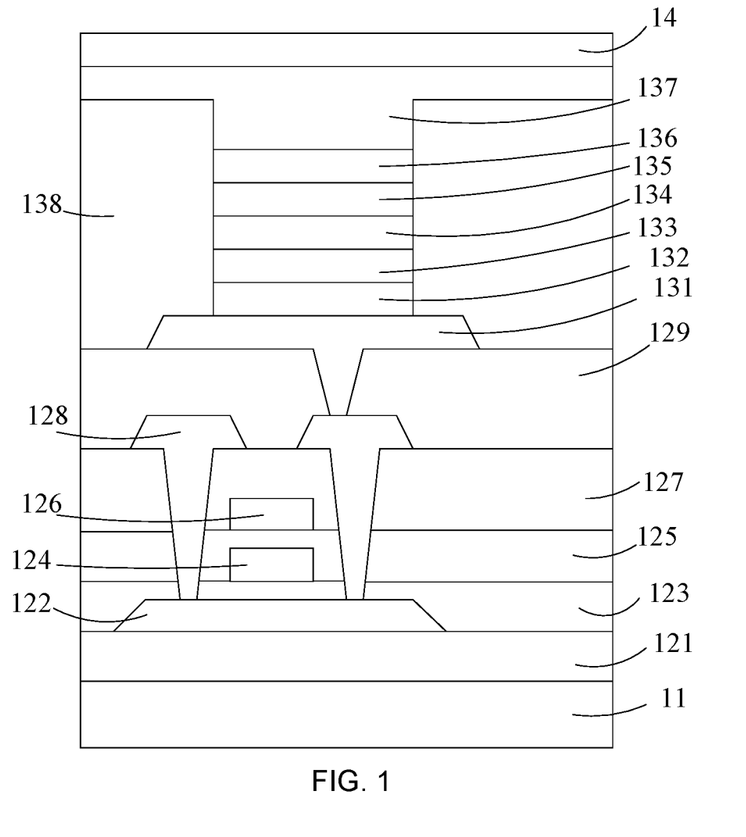
FIG. 1 is a first schematic diagram of an OLED display panel provided by an embodiment of the present disclosure.

As shown in FIG. 1, the present disclosure provides an OLED display panel, the OLED display panel comprises a substrate 11, a driving circuit layer disposed on one side of the substrate 11, a light-emitting functional layer disposed on one side of the driving circuit layer away from the substrate 11, and a pixel electrode layer 131, a hole injecting layer 132, a hole transport layer 133, a light-emitting layer 134, an electron transport layer 135, an electron injecting layer 136, and a common electrode layer 137 which are sequentially disposed along a direction away from the substrate 11, and an encapsulation layer 14 disposed on one side of the light-emitting functional layer away from the driving circuit layer. Wherein, a material of the light-emitting layer 134 comprises an organic host material, an organic light-emitting material, and an amorphous fluoropolymer.

An embodiment of the present embodiment provides an OLED display panel, the OLED display panel comprises a substrate, a driving circuit layer, a light-emitting functional layer, and an encapsulation layer. The driving circuit layer is disposed on one side of the substrate, the light-emitting functional layer is disposed on one side of the driving circuit layer away from the substrate, and a pixel electrode layer, a hole injecting layer, a hole transport layer, a light-emitting layer, an electron transport layer, an electron injecting layer, and a common electrode layer which are sequentially disposed along a direction away from the substrate, and the encapsulation layer is disposed on one side of the light-emitting functional layer away from the driving circuit layer. Wherein, a material of the light-emitting layer comprises an organic host material, an organic light-emitting material, and an amorphous fluoropolymer. The light-emitting layer is formed of organic host materials, organic light-emitting materials, and amorphous fluoropolymers when the OLED display panel is formed, so that amorphous polymers improve thermal stability and solvent resistance of the light-emitting layer. Due to the solvent corrosion resistance of the light-emitting layer improved, the light-emitting layer is not damaged by solvents when the electron transport layer is formed by solvents, thereby the light-emitting layer is not damaged when a film layer of the OLED display panel is formed by solvents, therefore an organic layer of the OLED display panel may be formed by whole solvents. The film layer of the OLED display panel is not damaged when the organic layer is formed by whole solvents, thereby resolving the process of processing OLED devices by solvents having damage to the light-emitting layer causing poor display performance in the prior art.

It should be noted that, the OLED display panel formed by whole solvents mentioned in the embodiment of the present disclosure means that the organic layer in the light-emitting functional layer which may be formed by solvents is formed by solvents, comprising the hole injecting layer, the hole transport layer, the light-emitting layer, and the electrode transport layer. The pixel electrode layer and the common electrode are oxides and are formed by evaporation or sputtering.

In one embodiment, as shown in FIG. 1, the driving circuit layer comprises a buffer layer 121, an active layer 122, a first gate insulating layer 123, a first metal layer 124, a second gate insulating layer 125, a second metal layer 126, an interlayer insulating layer 127, a source/drain layer 128, and a planarization layer 129. After the driving circuit layer is formed, the light-emitting layer is disposed on the driving circuit layer to produce the OLED display panel formed by whole solvents.

In one embodiment, as shown in FIG. 1, the light-emitting functional layer further comprises a pixel defining layer 138, the pixel defining layer 138 is disposed on the pixel electrode layer 131, the defining layer defines a light-emitting area. The hole injecting layer, the hole transport layer, the light-emitting layer, the electron transport layer, and the electron injecting layer are disposed in the light-emitting area defined by the pixel defining layer.

In one embodiment, a material of the pixel electrode layer comprises indium tin oxide and indium zinc oxide. The pixel defining layer is formed by magnetron sputtering.

In one embodiment, a thickness of the pixel electrode layer ranges from 50 nm to 200 nm.

In one embodiment, a material of the hole injecting layer comprises an organic small molecule and a polymer hole injecting material, the material of the hole injecting layer comprises poly(3,4-ethylenedioxythiophene) (PEDOT: PSS), the hole injecting layer may provide a hole injecting layer solvent containing the above materials, then hole injecting layer solvent is formed on the pixel electrode layer by spin coating or printing, the printing method comprises inkjet printing.

In one embodiment, a thickness of the hole injecting layer ranges from 1 nm to 200 nm.

In one embodiment, a material of the electron transport layer comprises an organic small molecule or a polymer electron transport material, the material of the hole transport layer comprises polyvinylcarbazole, the hole injecting layer may provide a hole transport layer solvent containing the above materials, then hole transport layer solvent is formed on the hole injecting layer by spin coating or printing. Since the hole injecting layer and the hole transport layer are formed of a crosslinked organic material, the hole transport layer solvent does not cause damage to the hole injecting layer when the hole transport layer is formed.

In one embodiment, a thickness of the electron transport layer ranges from 1 nm to 100 nm.

In one embodiment, a mass fraction of the organic host material in the light-emitting layer ranges from 10% to 80.

In one embodiment, the organic host material comprises 4,4'-Bis(9-carbazolyl)biphenyl, 1,3-Bis(9-carbazolyl)benzene, and 3,3'-Bis(9H-Carbozol-9-yl)-1,1'-biphenyl, wherein, the molecular formula of 4,4'-Bis(9-carbazolyl)biphenyl is $C_{36}H_{24}N_2$, referred to as CBP; the molecular formula of 1,3-Bis(9-carbazolyl)benzene is $C_{30}H_{20}N_2$, referred to as mCP; and the molecular formula of 3,3'-Bis(9H-Carbozol-9-yl)-1,1'-biphenyl is $C_{36}H_{24}N_2$, referred to as mCBP.

In one embodiment, a mass fraction of the organic light-emitting material in the light-emitting layer ranges from 1% to 30%.

In one embodiment, the organic light-emitting material comprises dichloromethane, Tris(2-phenylpyridine)iridium, and 2,4,5,6-Tetra(9-carbazoyl)isophthalonitrile, wherein, the molecular formula of dichloromethane is $CH_2Cl_2$, referred to as DCM, dichloromethane is a fluorescent material; Tris(2-phenylpyridine)iridium is called $Ir(ppy)^3$ and is a phosphorescent material; the molecular formula of 2,4,5,6-Tetra(9-carbazolyl)isophthalonitrile is $C_{56}H_{32}N_6$ and is called 4CzIPN; 2,4,5,6-Tetra(9-carbazolyl)isophthalonitrile is a thermally activated delayed fluorescent material, namely, the organic light-emitting material may be a fluorescent material or a phosphorescent material.

In one embodiment, a mass fraction of the amorphous fluoropolymer in the light-emitting layer ranges from 5% to 50%.

In one embodiment, the amorphous fluoropolymer comprises amorphous polytetrafluoroethylene.

In one embodiment, a thickness of the light-emitting layer ranges from 1 nm to 100 nm.

In one embodiment, a material of the electron transport layer comprises an organic small molecule electron transport material, the organic small molecule electron transport material comprises 2,7-bis(diphenylphosphoryl)-9,9'-spirobi[fluorene], the molecular formula of 2,7-bis(diphenylphosphoryl)-9,9'-spirobi[fluorene] is $C_{49}H_{34}O_2P_2$. After the light-emitting layer is formed of organic host materials, organic light-emitting materials and amorphous fluoropolymers, the electron transport layer may be formed by solvents, for example, an electron transport layer solvent containing the organic small molecule electron transport material is formed on the light-emitting layer by spin coating or printing. Since the light-emitting layer in the embodiment of the present disclosure has strong solvent corrosion resistance, the electron transport layer solvent does not erode the light-emitting layer, causing damage to the light-emitting layer.

In one embodiment, a thickness of the electron transport layer ranges from 1 nm to 100 nm.

In one embodiment, a material of the electron injecting layer comprises an alkali metal and a salt thereof, an alkaline earth metal and a salt thereof, and a metal complex, and the material of the electron injecting layer comprises lithium fluoride.

In one embodiment, a thickness of the electron injecting layer ranges from 1 nm to 100 nm.

In one embodiment, a material of the common electrode layer comprises a low work function metal material, a low work function metal alloy, a transparent metal oxide, the transparent metal oxide comprises indium tin oxide and indium zinc oxide, and the common electrode layer is formed on the electron injecting layer by vacuum evaporation.

In one embodiment, a thickness of the common electrode layer ranges from 10 nm to 200 nm.

Figure 2:
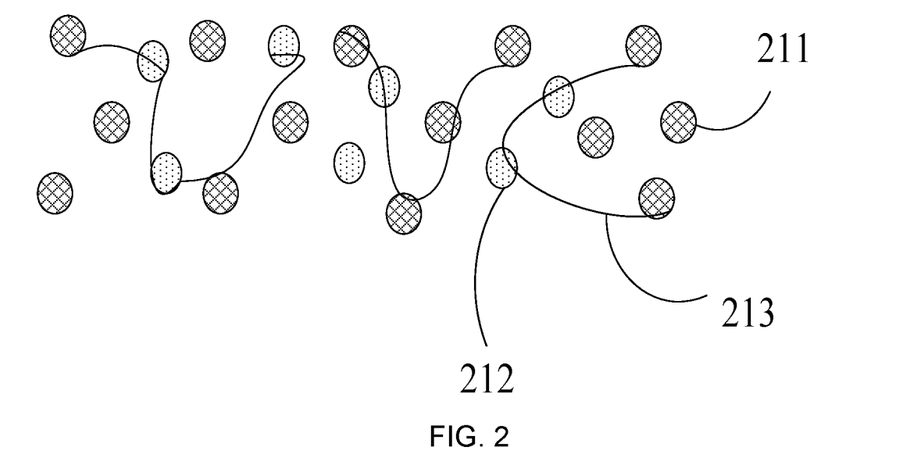
FIG. 2 is a schematic diagram of a light-emitting layer provided by an embodiment of the present disclosure.

In one embodiment, as shown in FIG. 2, an embodiment of the present disclosure provides a light-emitting layer, a material of the light-emitting layer comprises an organic host material 211, an organic light-emitting material 212, and an amorphous fluoropolymer 213.

An embodiment of the present disclosure provides an OLED display device comprising an OLED display panel, the OLED display panel comprising a substrate, a driving circuit layer disposed on one side of the substrate, a light-emitting functional layer disposed on one side of the driving circuit layer away from the substrate, and a pixel electrode layer, a hole injecting layer, a hole transport layer, a light-emitting layer, an electron transport layer, an electron injecting layer, and a common electrode layer which are sequentially disposed along a direction away from the substrate, and an encapsulation layer disposed on one side of the light-emitting functional layer away from the driving circuit layer. Wherein, a material of the light-emitting layer comprises an organic host material, an organic light-emitting material, and an amorphous fluoropolymer.

An embodiment of the present disclosure provides an OLED display device comprising an OLED display panel. The OLED display panel comprises a substrate, a driving circuit layer, a light-emitting functional layer, and an encapsulation layer. The driving circuit layer is disposed on one side of the substrate, the light-emitting functional layer is disposed on one side of the driving circuit layer away from the substrate, and a pixel electrode layer, a hole injecting layer, a hole transport layer, a light-emitting layer, an electron transport layer, an electron injecting layer, and a common electrode layer which are sequentially disposed along a direction away from the substrate, and the encapsulation layer is disposed on one side of the light-emitting functional layer away from the driving circuit layer. Wherein, a material of the light-emitting layer comprises an organic host material, an organic light-emitting material, and an amorphous fluoropolymer. The light-emitting layer is formed by organic host materials, organic light-emitting materials, and amorphous fluoropolymers, so that amorphous polymers improve thermal stability and solvent resistance of the light-emitting layer. Due to the solvent corrosion resistance of the light-emitting layer improved, the light-emitting layer is not damaged by the solvent when the electron transport layer is formed by solvents, thereby the light-emitting layer is not damaged when a film layer of the OLED display panel is formed by solvents, therefore an organic layer of the OLED display panel may be formed by the whole solvents. The film layer of the OLED display panel is not damaged when the organic layer is formed by whole solvents, thereby resolving the process of processing OLED devices by solvents having damage to the light-emitting layer causing poor display performance in the prior art.

Figure 3:
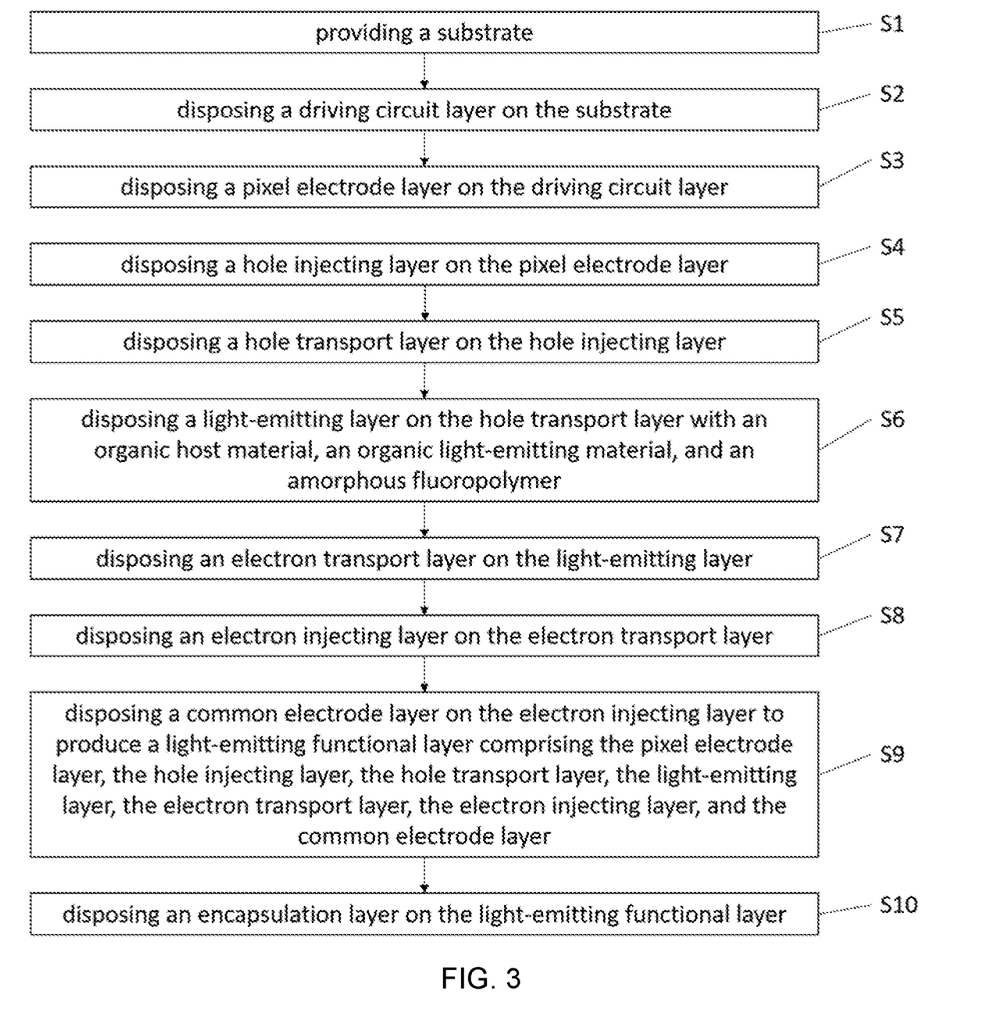
FIG. 3 is a flowchart diagram of a manufacturing method of an OLED display panel provided by an embodiment of the present disclosure.

As shown in FIG. 3, an embodiment of the present disclosure provides a manufacturing method of the OLED display panel, the manufacturing method of the OLED display panel comprises a step S1, providing a substrate; a step S2, disposing a driving circuit layer on the substrate; a step S3, disposing a pixel electrode layer on the driving circuit layer; a step S4, disposing a hole injecting layer on the pixel electrode layer; a step S5, disposing a hole transport layer on the hole injecting layer; a step S6, disposing a light-emitting layer on the hole transport layer using an organic host material, an organic light-emitting material, and an amorphous fluoropolymer, a step S7, disposing an electron transport layer on the light-emitting layer; a step S8, disposing an electron injecting layer on the electron transport layer; a step S9, disposing a common electrode layer on the electron injecting layer to produce a light-emitting functional layer comprising the pixel electrode layer, the hole injecting layer, the hole transport layer, the light-emitting layer, the electron transport layer, the electron injecting layer, and the common electrode layer; and a step S10, disposing an encapsulation layer on the light-emitting functional layer.

The embodiment of the present disclosure provides a manufacturing method of the OLED display panel. The OLED display panel formed by the manufacturing method of the OLED display panel comprises a substrate, a driving circuit layer, a light-emitting functional layer, and an encapsulation layer. The driving circuit layer is disposed on one side of the substrate, the light-emitting functional layer is disposed on one side of the driving circuit layer away from the substrate, and a pixel electrode layer, a hole injecting layer, a hole transport layer, a light-emitting layer, an electron transport layer, an electron injecting layer, and a common electrode layer which are sequentially disposed along a direction away from the substrate, and the encapsulation layer is disposed on one side of the light-emitting functional layer away from the driving circuit layer. Wherein, a material of the light-emitting layer comprises an organic host material, an organic light-emitting material, and an amorphous fluoropolymer. The light-emitting layer is formed of organic host materials, organic light-emitting materials, and amorphous fluoropolymers, so that amorphous polymers improve thermal stability and solvent resistance of the light-emitting layer. Due to the solvent corrosion resistance of the light-emitting layer improved, the light-emitting layer is not damaged by solvent when the electron transport layer is formed by solvents, thereby the light-emitting layer is not damaged when a film layer of the OLED display panel is formed by solvents, therefore an organic layer of the OLED display panel may be formed by whole solvents. The film layer of the OLED display panel is not damaged when the organic layer is formed by whole solvents, thereby resolving the process of processing OLED devices by solvents having damage to the light-emitting layer causing poor display performance in the prior art.

In one embodiment, the step of disposing a light-emitting layer on the hole transport layer with the organic host material, the organic light-emitting material, and the amorphous fluoropolymer comprises providing the organic host material, the organic light-emitting material, and the amorphous fluoropolymer; mixing the organic host material, the organic light-emitting material, the amorphous fluoropolymer, and a specific solvent to produce a light-emitting layer solvent; and disposing the light-emitting layer on the hole transport layer with the light-emitting layer solvent. When the light-emitting layer is formed, the organic host material, the organic light-emitting material, and the amorphous fluoropolymer is dissolved in a specific solvent, then the mixed solvent obtained by a solvent method is stirred at a certain temperature to produce an uniform light-emitting layer solvent, hereafter, the light-emitting layer solvent is formed on the hole transport layer by one of spin coating, inkjet printing, screen printing, and gravure printing.

In one embodiment, the step of providing organic host material, the organic light-emitting material, and the amorphous fluoropolymer comprises providing 4,4'-Bis(9-carbazolyl)biphenyl having a mass fraction of 60% as the organic host material; providing Tris(2-phenylpyridine)iridium having a mass fraction of 10% as the organic light-emitting material; and providing amorphous polytetrafluoroethylene having a mass fraction of 30% as amorphous fluoropolymer.

In one embodiment, the step of mixing the organic host material, the organic light-emitting material, the amorphous fluoropolymer, and the specific solvent to produce the light-emitting layer solvent comprises providing a mixture of a fluorine solvent and an aromatic hydrocarbon solvent to be the specific solvent; dissolving the organic host material, the organic light-emitting material, and the amorphous fluoropolymer in the mixture of the fluorine solvent and the aromatic hydrocarbon solvent to produce the mixed solvent; and processing the mixed solution under a specific condition to produce the light-emitting layer solvent, wherein, the fluorine solvent comprises FC40, FC77, and FC3282, and the aromatic hydrocarbon solvent comprises ethyl benzoate, o-xylene, p-xylene, o-dichlorobenzene, cyclohexylbenzene.

In one embodiment, the specific condition comprises stirring mixed solution at 60° C. for 12 hours.

In one embodiment, the step of disposing the light-emitting layer on the hole transport layer with the light-emitting layer solvent comprises printing the light-emitting layer solvent on the hole transport layer; and drying and baking the light-emitting layer solvent to produce the light-emitting layer, after spin coating or printing the light-emitting layer solvent on the hole transport layer, the solvent is dried to form a light-emitting layer by drying and baking the light-emitting layer solvent.

In one embodiment, the step of disposing the light-emitting layer on the hole transport layer comprises providing 2,7-bis(diphenylphosphoryl)-9,9'-spirobi[fluorene] as the organic small molecule electron transport material; and disposing the electron transport layer on the light-emitting layer with the organic small molecule electron transport material. After the light-emitting layer is formed of the organic host material, the organic light-emitting material, and the amorphous fluoropolymer, the electron transport layer may be formed by the solution method, and the organic small molecule electron transport material such as 2,7-bis(diphenylphosphoryl)-9,9'-spirobi[fluorene] may be dissolved in solvents, then the electron transport layer is formed by spin coating or printing.

Figure 4:
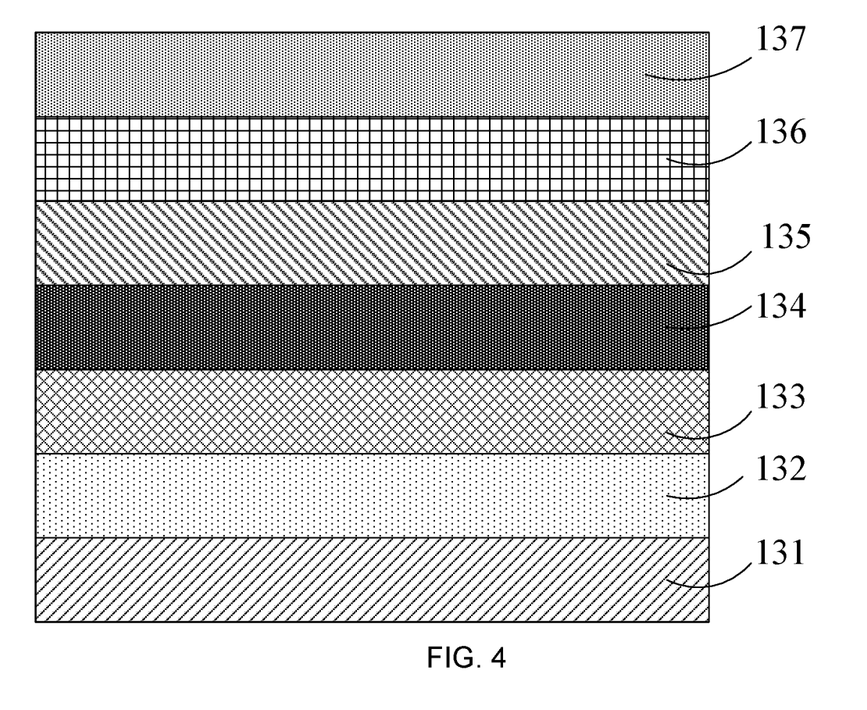
FIG. 4 is a second schematic diagram of an OLED display panel provided by an embodiment of the present disclosure.

As shown in FIG. 4, an embodiment of the present disclosure provides an OLED display panel, the OLED display panel comprises a pixel electrode layer 131, a hole injecting layer 132 disposed on the pixel electrode layer 131, a hole transport layer 133 disposed on the hole injecting layer 132, a light-emitting layer 134 disposed on the hole transport layer 133, an electron transport layer 135 disposed on the light-emitting layer 134, an electron injecting layer 136 disposed on the electron transport layer 135, a common electrode layer 137 disposed on the electron injecting layer 136, wherein, a material of the light-emitting layer comprises an organic host material, an organic light-emitting material, and an amorphous fluoropolymer.

In one embodiment, the pixel electrode layer is formed by sputtering with indium tin oxide, a thickness of the pixel electrode layer is 70 nm. The hole injecting layer is formed on the pixel electrode layer, the hole injecting layer solvent containing PEDOT:PSS is printed on the pixel electrode layer by inkjet printing, and formed by drying and baking, and a thickness of the hole injecting layer is 40 nm. The hole transport layer solvent containing polyvinylcarbazole is coated on the hole injecting layer by spin coating, and formed by drying and baking, and a thickness of the hole transport layer is 20 nm. The light-emitting layer solvent containing 4,4'-Bis(9-carbazolyl)biphenyl with a mass fraction of 60%, Tris(2-phenylpyridine)iridium with a mass fraction of 10%, and amorphous polytetrafluoroethylene with a mass fraction of 30% is inkjet printed on the hole transport layer, and dried and baked to produce the light-emitting layer, and a thickness of the light-emitting layer is 60 nm. The electron transport layer is formed on the light-emitting layer by the solvent containing 2,7-bis(diphenylphosphoryl)-9,9'-spirobi[fluorene], and a thickness of the electron transport layer is 30 nm. The electron injecting layer is formed on the electron transport layer of lithium fluoride, and a thickness of the electron injecting layer is 1 nm. The common electrode layer is formed on the electron injecting layer of indium zinc oxide, and a thickness of the common electrode layer is 50 nm.

According to the above embodiment, it can be known that the present disclosure provides an OLED display panel and a manufacturing method thereof, and an OLED display device. The OLED display panel comprises a substrate, a driving circuit layer, a light-emitting functional layer, and an encapsulation layer. The driving circuit layer is disposed on one side of the substrate, the light-emitting functional layer is disposed on one side of the driving circuit layer away from the substrate, and a pixel electrode layer, a hole injecting layer, a hole transport layer, a light-emitting layer, an electron transport layer, an electron injecting layer, and a common electrode layer which are sequentially disposed along a direction away from the substrate, and the encapsulation layer is disposed on one side of the light-emitting functional layer away from the driving circuit layer. Wherein, a material of the light-emitting layer comprises an organic host material, an organic light-emitting material, and an amorphous fluoropolymer. The light-emitting layer is formed of organic host materials, organic light-emitting materials, and amorphous fluoropolymers, so that amorphous polymers improve thermal stability and solvent resistance of the light-emitting layer. Due to the solvent corrosion resistance of the light-emitting layer improved, the light-emitting layer is not damaged by solvents when the electron transport layer is formed by solvents, thereby the light-emitting layer is not damaged when a film layer of the OLED display panel is formed by solvents, therefore an organic layer of the OLED display panel may be formed by whole solvents. The film layer of the OLED display panel is not damaged when the organic layer is formed by whole solvents, thereby resolving the process of processing OLED devices by solvents having damage to the light-emitting layer causing poor display performance in the prior art.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. An organic light-emitting diode display (OLED) panel, comprising:
 a substrate;
 a driving circuit layer disposed on one side of the substrate;
 a light-emitting functional layer disposed on one side of the driving circuit layer away from the substrate, wherein the light-emitting functional layer includes a pixel electrode layer, a hole injecting layer, a hole transport layer, a light-emitting layer, an electron transport layer, an electron injecting layer, and a common electrode layer which are sequentially disposed along a direction away from the substrate; and an encapsulation layer disposed on one side of the light-emitting functional layer away from the driving circuit layer;

wherein a material of the light-emitting layer comprises an organic host material, an organic light-emitting material, and an amorphous fluoropolymer.

2. The OLED display panel as claimed in claim 1, wherein a mass fraction of the organic host material in the light-emitting layer ranges from 10% to 80%.

3. The OLED display panel as claimed in claim 2, wherein the organic host material comprises 4,4'-Bis(9-carbazolyl) biphenyl, 1,3-Bis(9-carbazolyl)benzene, and 3,3'-Bis(9H-Carbozol-9-yl)-1,1'-biphenyl.

4. The OLED display panel as claimed in claim 1, wherein a mass fraction of the organic light-emitting material in the light-emitting layer ranges from 1% to 30%.

5. The OLED display panel as claimed in claim 4, wherein the organic light-emitting material comprises dichloromethane, Tris(2-phenylpyridine)iridium, and 2,4,5,6-Tetra(9-carbazolyl)isophthalonitrile.

6. The OLED display panel as claimed in claim 1, wherein a mass fraction of the amorphous fluoropolymer in the light-emitting layer ranges from 5% to 50%.

7. The OLED display panel as claimed in claim 6, wherein the amorphous fluoropolymer comprises amorphous polytetrafluoroethylene.

8. The OLED display panel as claimed in claim 1, wherein a thickness of the light-emitting layer ranges from 1 nm to 100 nm.

9. The OLED display panel as claimed in claim 1, wherein a material of the electron transport layer comprises an organic small molecule electron transport material.

10. The OLED display panel as claimed in claim 9, wherein the organic small molecule electron transport material comprises 2,7-bis(diphenylphosphoryl)-9,9'-spirobi[fluorene].

11. The OLED display panel as claimed in claim 9, wherein a thickness of the electron transport layer ranges from 1 nm to 100 nm.

12. The OLED display panel as claimed in claim 1, wherein a material of the electron injecting layer comprises an alkali metal and a salt thereof, an alkaline earth metal and a salt thereof, and a metal complex.

13. The OLED display panel as claimed in claim 12, wherein a material of the electron injecting layer comprises lithium fluoride.

14. The OLED display panel as claimed in claim 12, wherein a thickness of the electron injecting layer ranges from 1 nm to 100 nm.

15. The OLED display panel as claimed in claim 1, wherein a material of the common electrode layer comprises one of indium tin oxide and indium zinc oxide.

16. An organic light-emitting diode display (OLED) device comprising an OLED display panel, the OLED display panel comprising:
a substrate;
a driving circuit layer disposed on one side of the substrate;
a light-emitting functional layer disposed on one side of the driving circuit layer away from the substrate, wherein the light-emitting functional layer includes a pixel electrode layer, a hole injecting layer, a hole transport layer, a light-emitting layer, an electron transport layer, an electron injecting layer, and a common electrode layer which are sequentially disposed along a direction away from the substrate; and
an encapsulation layer disposed on one side of the light-emitting functional layer away from the driving circuit layer;
wherein a material of the light-emitting layer comprises an organic host material, an organic light-emitting material, and an amorphous fluoropolymer.

17. A manufacturing method of an organic light-emitting diode (OLED) display panel, comprising:
providing a substrate;
disposing a driving circuit layer on the substrate;
disposing a pixel electrode layer on the driving circuit layer;
disposing a hole injecting layer on the pixel electrode layer;
disposing a hole transport layer on the hole injecting layer;
disposing a light-emitting layer on the hole transport layer with an organic host material, an organic light-emitting material, and an amorphous fluoropolymer;
disposing an electron transport layer on the light-emitting layer;
disposing an electron injecting layer on the electron transport layer;
disposing a common electrode layer on the electron injecting layer to produce a light-emitting functional layer comprising the pixel electrode layer, the hole injecting layer, the hole transport layer, the light-emitting layer, the electron transport layer, the electron injecting layer, and the common electrode layer; and
disposing an encapsulation layer on the light-emitting functional layer.

18. The manufacturing method of the OLED display panel as claimed in claim 17, wherein the step of disposing a light-emitting layer on the hole transport layer with the organic host material, the organic light-emitting material, and the amorphous fluoropolymer comprises:
providing the organic host material, the organic light-emitting material, and the amorphous fluoropolymer;
mixing the organic host material, the organic light-emitting material, the amorphous fluoropolymer, and a specific solvent to produce a light-emitting layer solvent; and
disposing the light-emitting layer on the hole transport layer with the light-emitting layer solvent.

19. The manufacturing method of the OLED display panel as claimed in claim 18, wherein the step of mixing the organic host material, the organic light-emitting material, the amorphous fluoropolymer, and the specific solvent to produce a light-emitting layer solvent comprises:
providing a mixture of a fluorine solvent and an aromatic hydrocarbon solvent to be the specific solvent;
dissolving the organic host material, the organic light-emitting material, and the amorphous fluoropolymer in the mixture of the fluorine solvent and the aromatic hydrocarbon solvent to produce a mixed solvent; and
processing the mixed solution under a specific condition to produce the light-emitting layer solvent.

20. The manufacturing method of the OLED display panel as claimed in claim 18, wherein the step of disposing the light-emitting layer on the hole transport layer with the light-emitting layer solvent comprises:
printing the light-emitting layer solvent on the hole transport layer; and drying and baking the light-emitting layer solvent to produce the light-emitting layer.

* * * * *